US006979907B2

(12) United States Patent
Li et al.

(10) Patent No.: US 6,979,907 B2

(45) Date of Patent: Dec. 27, 2005

(54) INTEGRATED CIRCUIT PACKAGE

(75) Inventors: Jian Jun Li, Singapore (SG); Il Kwon Shim, Singapore (SG); Guruprasad Badakere, Singapore (SG)

(73) Assignee: St Assembly Test Services Ltd., Singapore (SG)

( * ) Notice: Subject to any disclaimer, the term of this patent is extended or adjusted under 35 U.S.C. 154(b) by 0 days.

(21) Appl. No.: 10/969,361

(22) Filed: Oct. 19, 2004

(65) Prior Publication Data

US 2005/0051907 A1 Mar. 10, 2005

Related U.S. Application Data

(62) Division of application No. 10/251,231, filed on Sep. 19, 2002, now Pat. No. 6,855,573.

(51) Int. Cl.$^{7}$ .............................................. H01L 23/12

(52) U.S. Cl. ...................... 257/783; 257/782; 257/783; 257/786

(58) Field of Search ................................ 257/783, 782, 257/786, 772, 773, 776, 691

(56) References Cited

U.S. PATENT DOCUMENTS

| | | | | |
|---|---|---|---|---|
| 5,736,789 | A * | 4/1998 | Moscicki | 257/774 |
| 5,808,873 | A * | 9/1998 | Celaya et al. | 361/760 |
| 6,025,650 | A * | 2/2000 | Tsuji et al. | 257/786 |
| 6,034,437 | A * | 3/2000 | Shibata | 257/783 |
| 6,593,658 | B2 * | 7/2003 | Huang et al. | 257/773 |
| 6,707,152 | B1 * | 3/2004 | Schrock | 257/738 |

FOREIGN PATENT DOCUMENTS

| | | | |
|---|---|---|---|
| JP | 5-129366 | * 5/1993 | 257/786 |

* cited by examiner

*Primary Examiner*—Jasmine Clark
(74) *Attorney, Agent, or Firm*—Mikio Ishimaru

(57) ABSTRACT

An integrated circuit package is provided. A substrate is provided having solder openings therein and a conductive layer thereon. The conductive layer is processed to form a plurality of pads over the solder openings in the substrate. A mask is formed over the plurality of pads and openings formed in the mask over at least two pads of the plurality of pads. An integrated circuit die is bonded over the substrate using a conductive adhesive where the conductive adhesive is placed in the openings in conductive contact with at least two pads of the plurality of pads.

10 Claims, 7 Drawing Sheets

INTEGRATED CIRCUIT PACKAGE

CROSS-REFERENCE TO RELATED APPLICATION

This is a divisional of application Ser. No. 10/251,231, filed Sep. 19, 2002 now U.S. Pat. No. 6,855,573, which is incorporated herein by reference thereto.

BACKGROUND

1. Technical Field

The present invention relates generally to the fabrication of semiconductor integrated circuits, and more specifically to ball grid array packages and chip scale packages.

2. Background Art

In the electronics industry, the continuing goal has been to reduce the size of electronic devices such as camcorders and portable telephones while increasing performance and speed. In the past, integrated circuits were packaged in lead-frame packages, but the packaging technology has been moving towards ball grid array (BGA) packages and chip scale (CSP) packages as higher performance packages are required.

Lead-frame packages generally have small metal strips or leads, which extend from the undersides of the packages and which are soldered to the printed circuit boards used in the various products. They have been used for a long period of time in integrated circuit packaging history mainly because of their low manufacturing cost and high reliability. However, as integrated circuits products move toward being both faster and smaller in size, the traditional lead frame packages have become gradually obsolete for many small, high performance-required packages.

BGA packages are widely used for integrated circuit chips that have higher numbers of input and output connections, and which need better electrical and thermal performance than lead-frame packages. Balls of solder are formed on the undersides of the packages and are melted to connect the packages to the printed circuit boards. These packages are generally used in high performance central processing unit (CPU) and video-graphic chips.

The CSP packages are generally used for integrated circuits having 100 or more input/output pins and a large integrated circuit size. Generally, packages that are smaller than 120% of the size of the integrated circuit are typically referred to as CSP packages. The CSP packages have been widely used in mobile products where the footprint (the size of the package on a substrate), package profile, and package weight are of major concern. CSP packages can also be BGA packages as well as other small packages such as land grid array (LGA) packages with a single grid array on the bottoms, and small outline non-leaded (SON) packages with multiple grid arrays on the bottom.

A BGA or CSP package generally consists of a substrate having openings for the ball grid array or connections. The substrate is generally of a polyimide. On the substrate are a plurality of electrical traces including ground traces and power traces. On the substrate over the conductive traces, which are generally of copper, there is an epoxy, which bonds an integrated circuit die to the substrate.

A single metal layer BGA or a CSP package does not have a separate ground plane or closed loop ground. Where a netlist (the list of the required connections) requires a connection between opposite sides of an integrated circuit to power, the power connection is made directly across the substrate using the single metal layer by patterning and etching the metal to the desired cross-connect configuration. Since the ground must be insulated from the power, geometric constraints prevent the use of the single metal layer for a ground cross-connect between opposites sides of an integrated circuit; e.g., the cross-connects cannot intersect.

A second metal layer entails additional cost and complexity because of the additional processing and layers required of insulation, metal, and epoxy. In addition, the second metal layer would result in a substantially increased height for the package.

Solutions to these problems have been long sought, but have long eluded those skilled in the art.

SUMMARY OF THE INVENTION

The present invention provides an integrated circuit package. A substrate is provided having solder openings therein and a conductive layer thereon. The conductive layer is processed to form a plurality of pads over the solder openings in the substrate. A mask is formed over the plurality of pads and openings formed in the mask over at least two pads of the plurality of pads. An integrated circuit die is bonded over the substrate using a conductive adhesive where the conductive adhesive is placed in the openings in conductive contact with at least two pads of the plurality of pads. This package allows for simplified manufacturing, great flexibility in interconnection routing, and increased electrical performance.

Certain embodiments of the invention have other advantages in addition to or in place of those mentioned above. The advantages will become apparent to those skilled in the art from a reading of the following detailed description when taken with reference to the accompanying drawings.

DETAILED DESCRIPTION OF THE INVENTION

Figure 1:
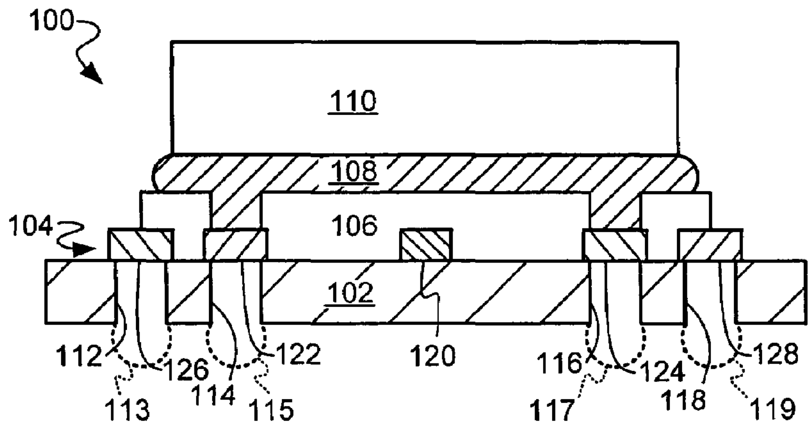
FIG. 1 is a cross-sectional view of an example of an integrated circuit package in accordance with the present invention.

Referring now to FIG. 1, therein is shown a cross-sectional view of an example of an integrated circuit package in accordance with the present invention. Although the integrated circuit package can be of any type, including a BGA package or a CSP package, the example shown is a ball grid array (BGA) package 100.

The BGA package 100 has a substrate 102 having a metal layer 104. The metal layer 104 may be bonded to or integrally deposited on the substrate 102. The metal layer 104 is patterned and processed to form a plurality of pads. Leads (not shown) are used to connect the plurality of pads to an integrated circuit die 110.

For purposes of the present invention, the term "horizontal" as used in herein is defined as a plane parallel to the conventional plane or surface of a substrate, regardless of its orientation. The term "vertical" refers to a direction perpendicular to the horizontal as just defined. Terms, such as "on", "above", "below", "beside", "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure.

A soldermask 106, such as a thermal soldermask, is disposed around and over the metal layer 104 to isolate and insulate several of the plurality of pads.

A conductive die attach adhesive 108 is deposited over the soldermask 106 and is used to secure the integrated circuit die 110 to the soldermask 106.

The substrate 102 has solder openings 112, 114, 116, and 118 which expose plurality of pads of the metal layer 104 in the underside to allow solder 113, 115, 117, and 119, shown in dotted outline, to be used to electrically connect the integrated circuit die 110 to a printed circuit board (not shown).

The plurality of pads includes ground pads 122 and 124, which are connected to the integrated circuit die 110, as well as other pads 126 and 128, which are input/output (I/O) pads for the integrated circuit die 110 and a power cross-connect 120.

Figure 2:
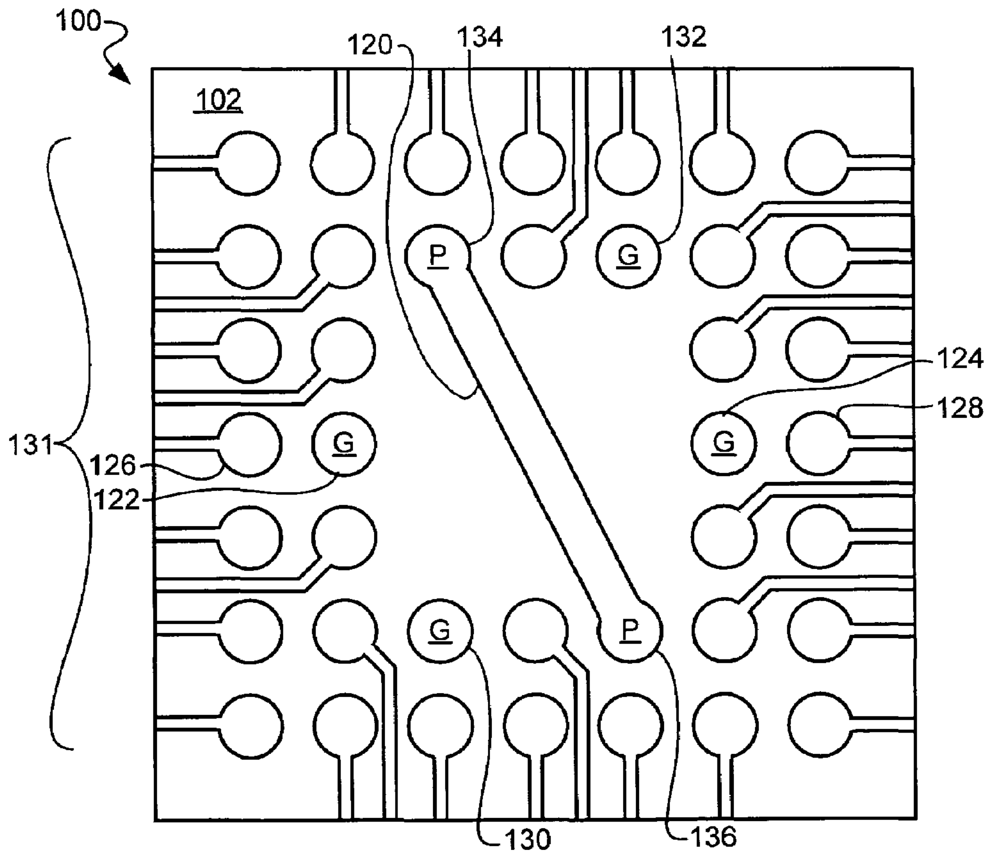
FIG. 2 is a plan view of a package substrate in an intermediate stage of manufacture in accordance with the present invention.

Referring now to FIG. 2, therein is shown a plan view of a package substrate in an intermediate stage of manufacture in accordance with the present invention in which the substrate 102 for the BGA package 100 is in an intermediate stage of manufacture. The substrate 102 has been processed to form the plurality of pads 131 in the metal layer 104, as described above, and further including ground pads 130 and 132 as well as power pads 134 and 136.

The power cross-connect 120 extending diagonally across the substrate 102 from one side to another connects the power pads 134 and 136. As can be seen, the power cross-connect 120 prevents the placement of a ground cross-connect in the metal layer 104 to connect the ground pads 122, 124, 130, and 132 because such a cross-connect would intersect the power cross-connect 120.

Figure 3:
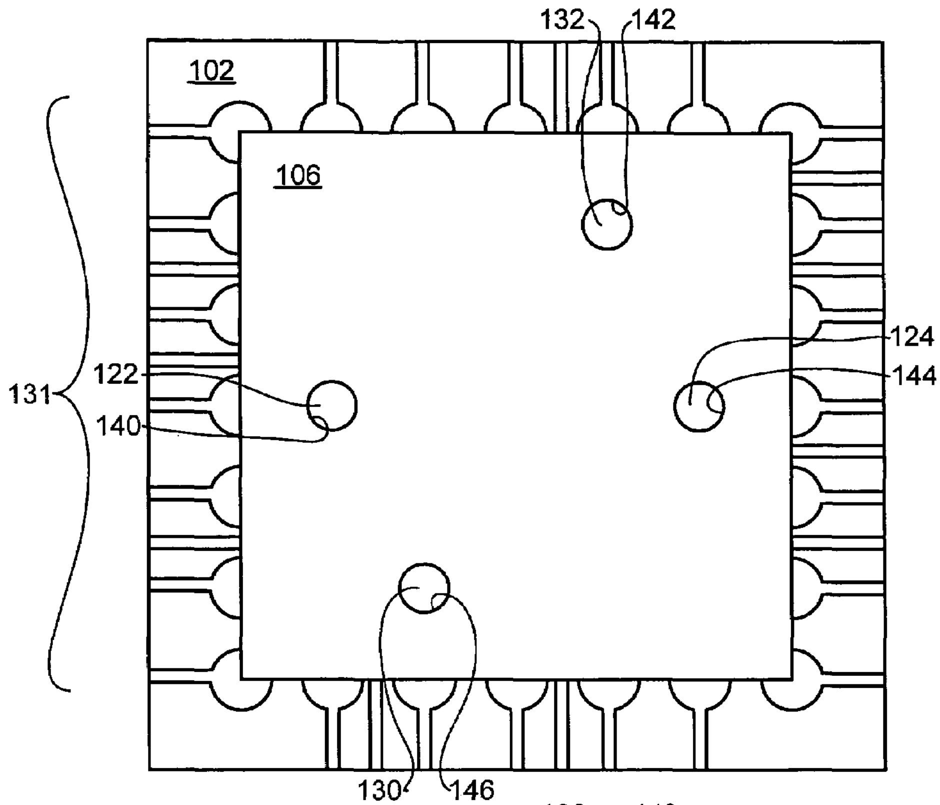
FIG. 3 is the structure of FIG. 2 after deposition and patterning of a soldermask.

Referring now to FIG. 3, therein is shown the structure of FIG. 2 after deposition and patterning of the soldermask 106. The soldermask 106 has been processed to form openings 140, 142, 144, and 146 respectively over the ground pads 122, 132, 124, and 130.

Figure 4:
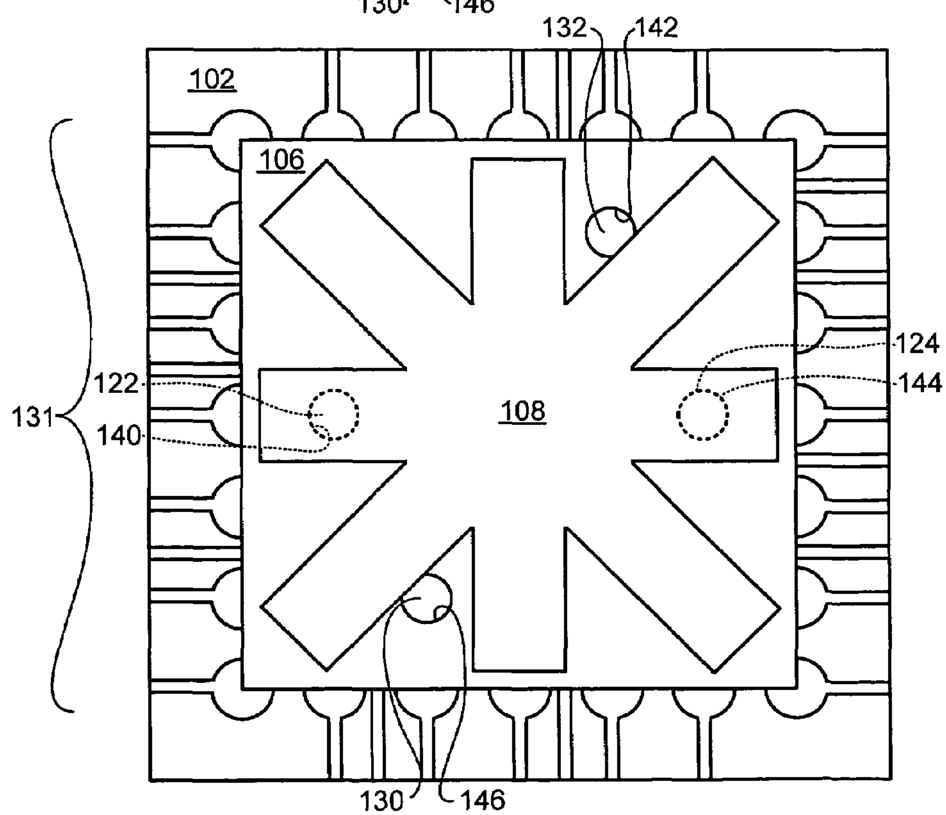
FIG. 4 is the structure of FIG. 3 after the deposition of a conductive die attach adhesive on the soldermask.

Referring now to FIG. 4, therein is shown the structure of FIG. 3 after deposition of the conductive die attach adhesive 108 on the soldermask 106. An adhesive dispensing machine (not shown) in the assembly process provides the criss-cross pattern of the conductive die attach adhesive 108. The openings 140, 142, 144, or 146 may or may not be filled with the conductive die attach adhesive 108 at this point.

Figure 5:
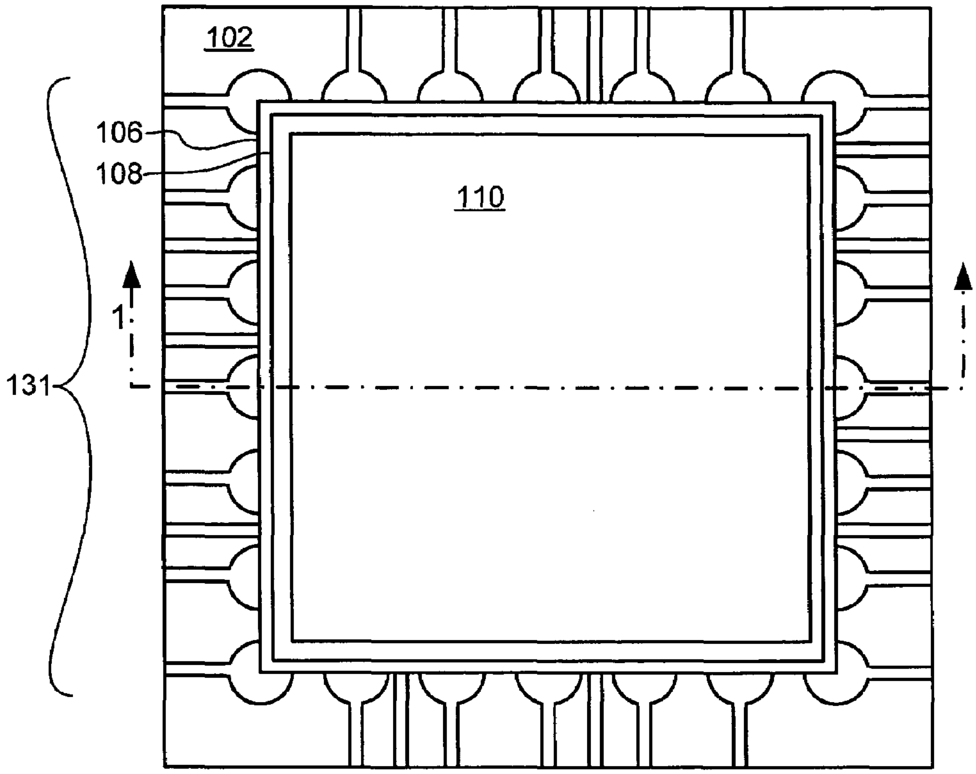
FIG. 5 is the structure of FIG. 4 with an integrated circuit die bonded to the soldermask.

Referring now to FIG. 5, therein is shown the structure of FIG. 4 having the integrated circuit die 110 bonded by the conductive die attach adhesive 108 to the soldermask 106. At this point, the openings 140, 142, 144, and 146 will be filled with the conductive die attach adhesive 108 due to flow caused by bonding pressure used for bonding the integrated circuit die 110 and the soldermask 106.

By reference to the cross-section indicated by the line 1—1 (which is shown in FIG. 1), it may be seen that the ground pads 122 and 124 (and, although not shown, the ground pads 130 and 132) are conductively connected by the conductive die attach adhesive 108. The soldermask 106 insulates the power cross-connect 120 from the conductive die attach adhesive 108, which acts both as a ground cross-connect as well as a ground plane.

With the above invention it has been discovered that cross-connections can be made above the metal layer cross-connections without the need for a second metal layer. This means the additional processing and layers of insulation, metal, and adhesive are required and there is no increase in the height for the BGA package 100.

Figure 6:
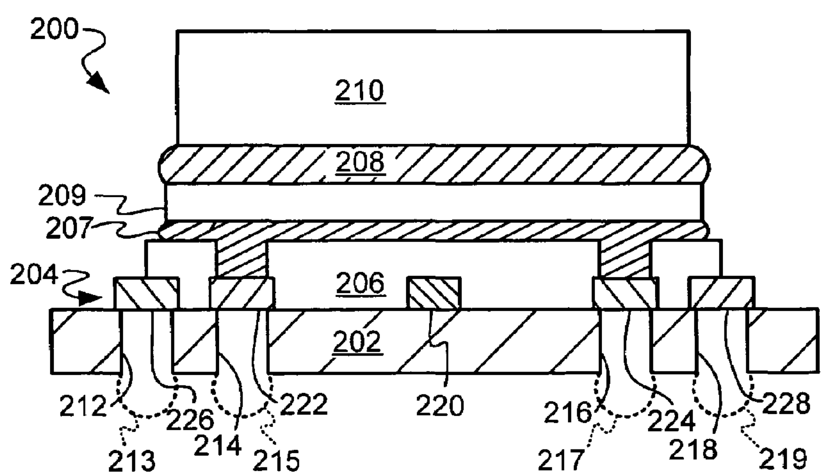
FIG. 6 is a cross-sectional view of another example of an integrated circuit package in accordance with the present invention.

Referring now to FIG. 6, therein is shown a cross-sectional view of another example of an integrated circuit package in accordance with the present invention. Again, although the integrated circuit package can be of any type, including a BGA package or a CSP package, the example shown is a ball grid array (BGA) package 200.

The BGA package 200 has a substrate 202 having a metal layer 204. The metal layer 204 is patterned and processed to form a plurality of pads. Leads (not shown) are used to connect the plurality of pads to an integrated circuit die 210.

A soldermask 206 is disposed around and over the metal layer 204 to isolate and insulate several of the plurality of pads 231.

A first conductive die attach adhesive 207 is deposited over the soldermask 206 and is used to secure a separate ground plane 209 to the soldermask 206.

A second conductive die attach adhesive 208 is deposited over the separate ground plane 209 and is used to secure the integrated circuit die 210 to the separate ground plane.

The substrate 202 has solder openings 212, 214, 216, and 218 which expose the metal layer 204 to allow solder 213, 215, 217, and 219, shown in dotted outline, to be used to electrically connect the integrated circuit die 210 to a printed circuit board (not shown).

The plurality of pads includes ground pads 222 and 224, which are connected to the integrated circuit die 210, as well as other pads 226 and 228, which are input/output (I/O) pads for the integrated circuit die 210 and a power cross-connect 220.

Figure 7:
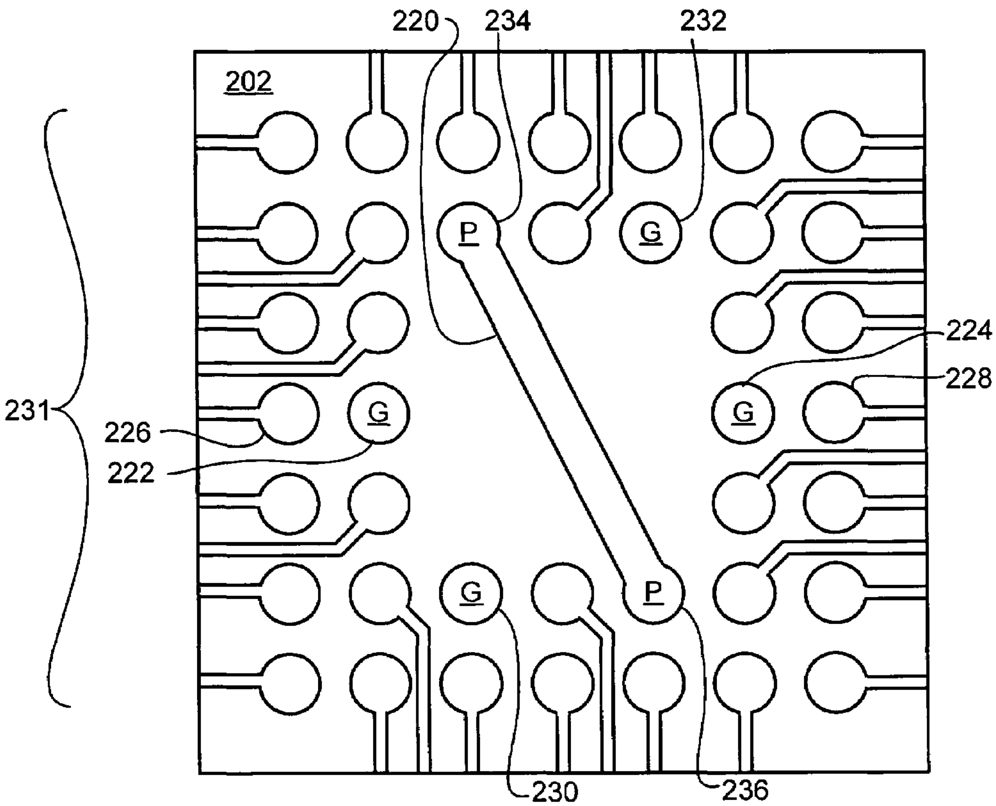
FIG. 7 is a plan view of a package substrate in an intermediate stage of manufacture in accordance with the present invention.

Referring now to FIG. 7, therein is shown a plan view of a package substrate in an intermediate stage of manufacture in accordance with the present invention in which the substrate 102 for the BGA package 100 is in an intermediate stage of manufacture. The substrate 202 has been processed to form the plurality of pads 231 in the metal layer 204, as described above, and further including ground pads 230 and 232 as well as power pads 234 and 236.

The power cross-connect 220 extending diagonally across the substrate 202 from one side to another connects the power pads 234 and 236. As can be seen, the power cross-connect 220 prevents the placement of a ground cross-connect in the metal layer 204 to connect the ground pads 222, 224, 230, and 232 because such a cross-connect would intersect the power cross-connect 220.

Figure 8:
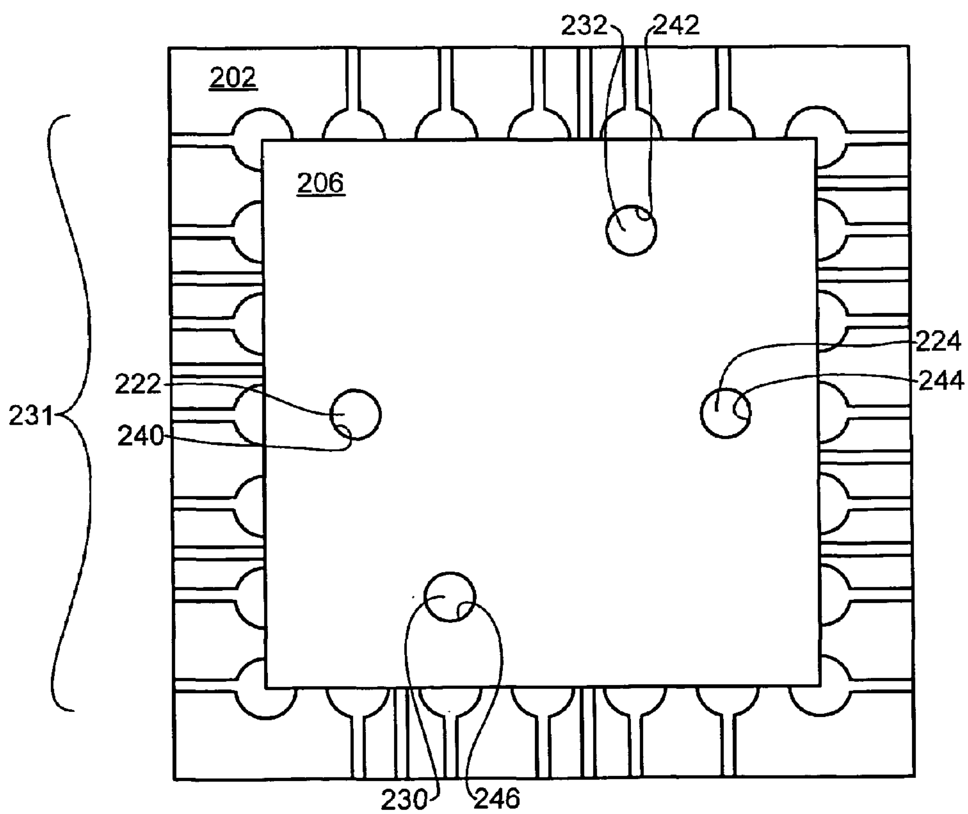
FIG. 8 is the structure of FIG. 7 after deposition and patterning of a soldermask.

Referring now to FIG. 8, therein is shown the structure of FIG. 7 after deposition and patterning of a soldermask 206. The soldermask 206 has been processed to form openings 240, 242, 244, and 246 respectively over the ground pads 222, 232, 224, and 230.

Figure 9:
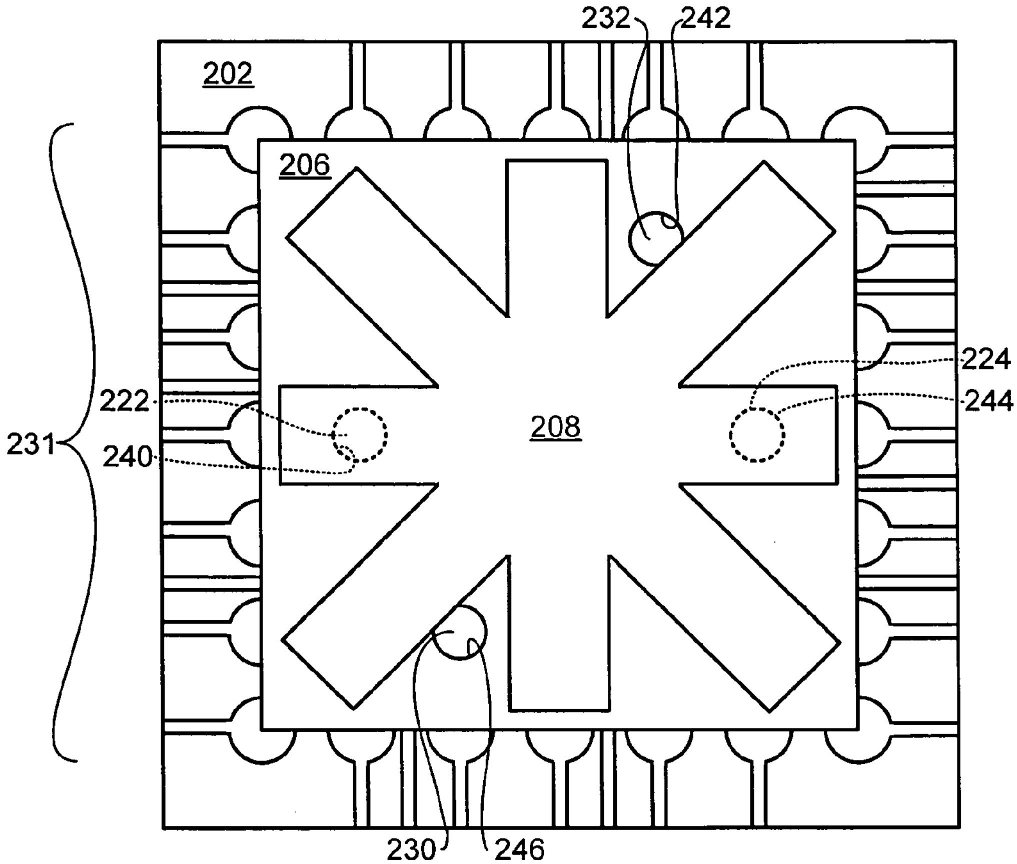
FIG. 9 is the structure of FIG. 8 after deposition of a conductive die attach adhesive on the soldermask.

Referring now to FIG. 9, therein is shown the structure of FIG. 8 after deposition of the conductive die attach adhesive 208 on the soldermask 206. An adhesive dispensing machine (not shown) in the assembly process provides the criss-cross pattern of the conductive die attach adhesive 208. The openings 240, 242, 244, or 246 may or may not be filled with conductive die attach adhesive 208 at this point.

Figure 10:
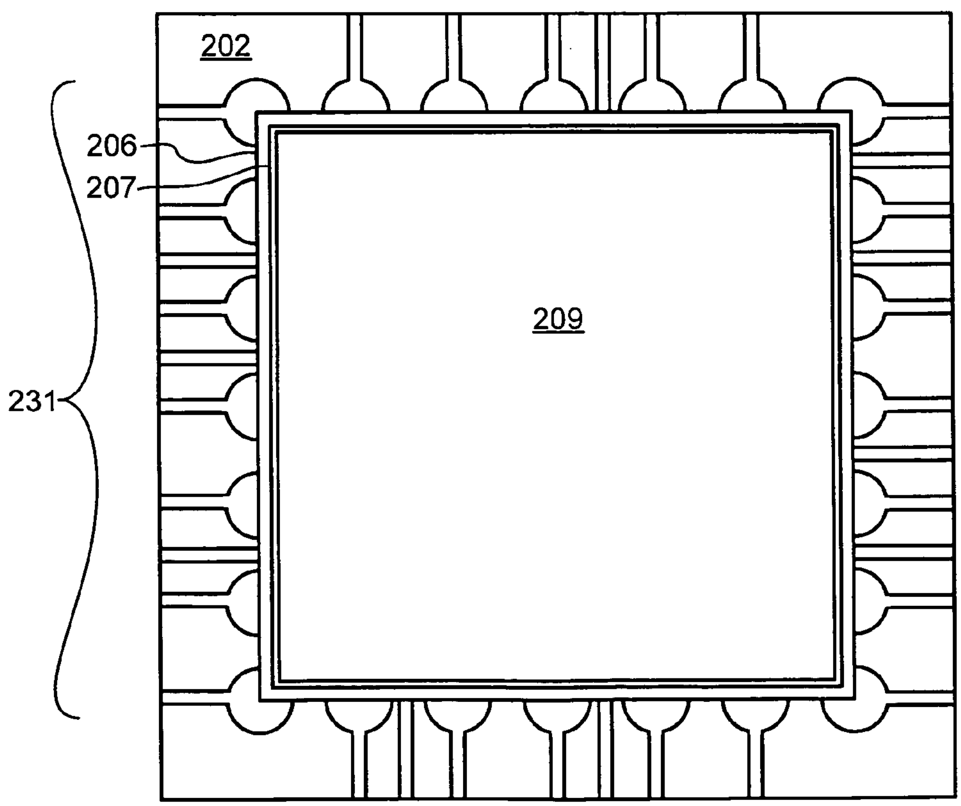
FIG. 10 is the structure of FIG. 9 having a ground plane bonded to the soldermask.

Referring now to FIG. 10, therein is shown the structure of FIG. 9 having the ground plane 209 bonded thereto. The openings 240, 242, 244, and 246 will be filled with the conductive die attach adhesive 207 at this point due to flow caused by the application of pressure for bonding the ground plane 209 and the soldermask 206.

The ground plane 209 is attached for high frequency applications where the conductive die attach adhesive 208 is insufficient to act as a ground plane. The ground plane 209 is a conductive material such as copper in the form of a foil.

Figure 11:
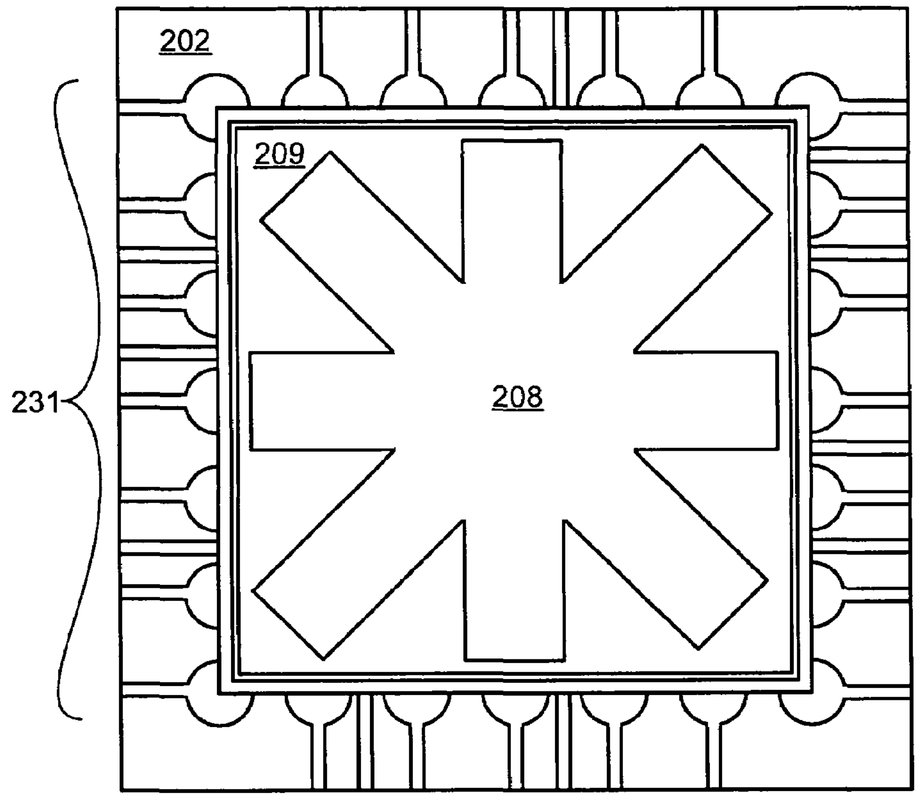
FIG. 11 is the structure of FIG. 10 after deposition of additional conductive die attach adhesive on the ground plane.

Referring now to FIG. 11, therein is shown the structure of FIG. 10 after the deposition of a conductive die attach adhesive 208 on the ground plane 209. An adhesive dispensing machine (not shown) in the assembly process provides a criss-cross pattern of the conductive die attached adhesive 208.

Figure 12:
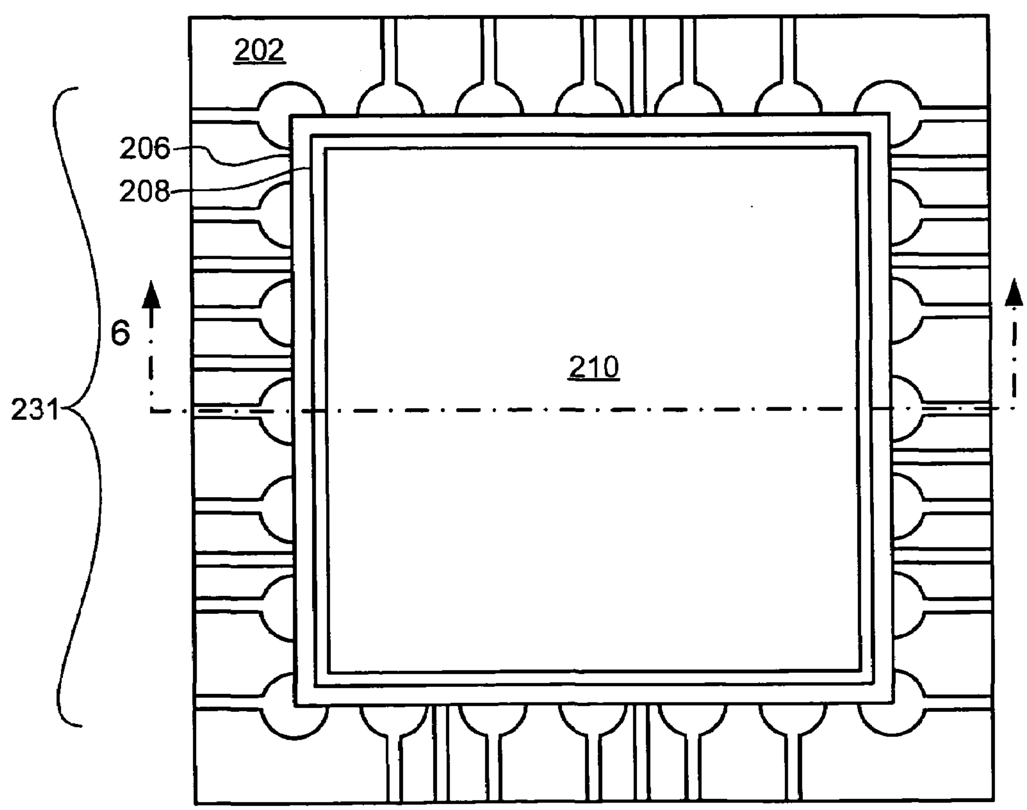
FIG. 12 is the structure of FIG. 11 with an integrated circuit die bonded to the ground plane.

Referring now to FIG. 12, therein is shown the structure of FIG. 11 having the integrated circuit die 210 bonded by the conductive die attach adhesive 208 to the ground plane 209.

By reference to the cross-section indicated by the line 6—6 (which is shown in FIG. 6), it may be seen that the ground pads 222 and 224 (and, although not shown, the ground pads 230 and 232) are conductively connected by the conductive die attach adhesive 207 and the ground plane 209. The soldermask 206 insulates the power cross-connect 220 from the conductive die attach adhesive 207 and the ground plane 209.

With the above invention it has been discovered that cross-connections can be made above the metal layer cross-connections without the need for a second metal layer, which would require deposition and processing of an insulator over the power cross-connect, and deposition and processing of the second metal layer. This means the additional processing and layers of insulation, metal, and adhesive are not required and there is minimal increase in the height for the BGA package 200.

As will be understood by those skilled in the art, the above invention can also be used for other packages where it is desirable to eliminate or replace one or more metal layers in the integrated circuit package.

Figure 13:
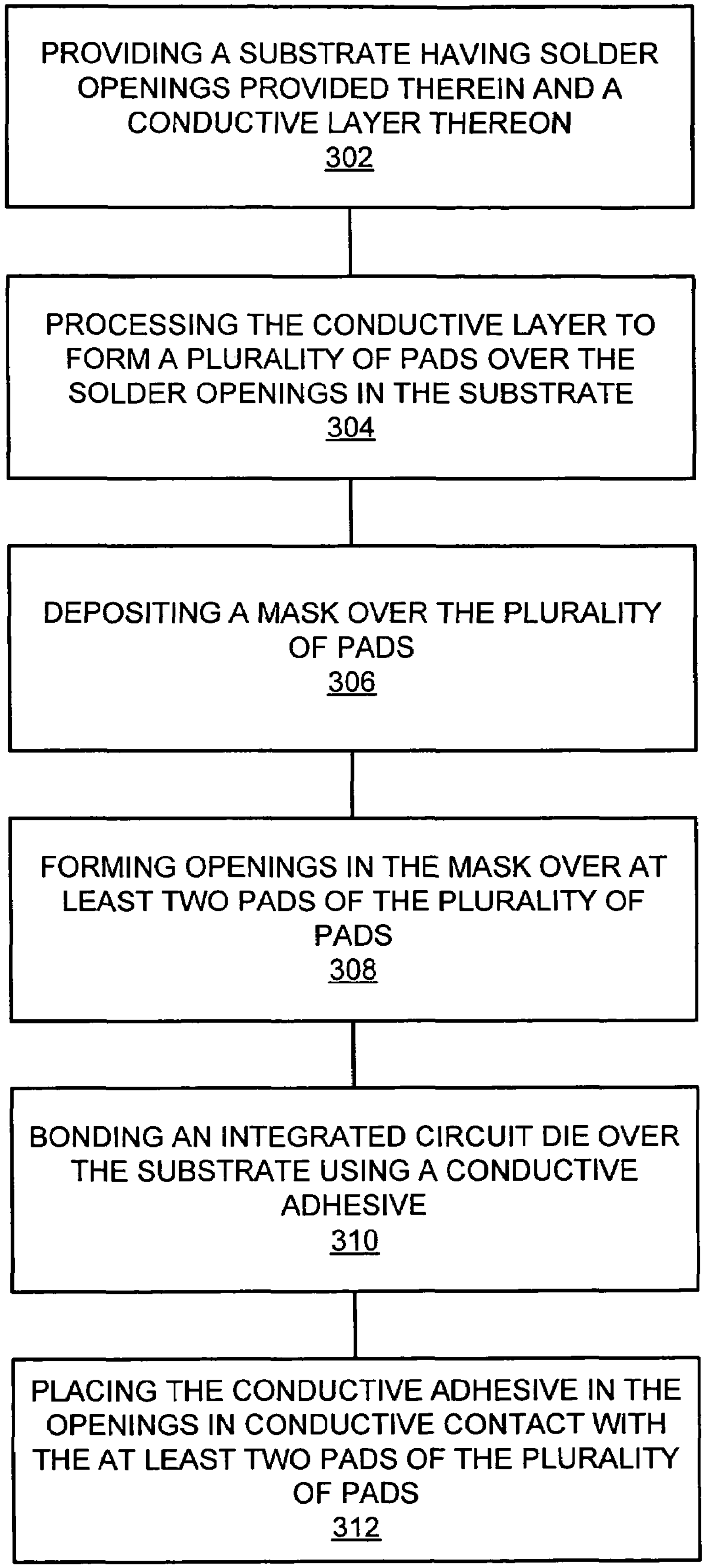
FIG. 13 is a flowchart of a method for manufacturing an integrated circuit package in accordance with the present invention.

Referring now to FIG. 13, therein is shown a flowchart of a method 300 in accordance with the present invention. The method 300 includes a first step 302 of providing a substrate having solder openings provided therein and a conductive layer thereon; a step 304 for processing the conductive layer to form a plurality of pads over the solder openings in the substrate; a step 306 of depositing a mask over the plurality of pads; a step 308 for forming openings in the mask over at least two pads of the plurality of pads; a step 310 of bonding an integrated circuit die over the substrate using a conductive adhesive; and a step 312 of placing the conductive adhesive in the openings in conductive contact with the at least two pads of the plurality of pads.

In the present invention, the substrates 102 and 202 will be a polyimide film. The metal layers 104 and 204 will be of copper and the ground plane 209 will be a copper foil. The soldermasks 106 and 206 will be of one of the many commercially available solder resist materials, and the conductive die attach adhesives 108, 207, and 208 will be of a conductive epoxy.

The integrated circuit die 110 and 210 will be connected by conventional means to the plurality of pads 131 and 231.

While the invention has been described in conjunction with a specific best mode, it is to be understood that many alternatives, modifications, and variations will be apparent to those skilled in the art in light of the a foregoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. An integrated circuit comprising:

a substrate having solder openings provided therein;

a conductive layer on the substrate forming a plurality of pads over the solder openings in the substrate;

a mask over the plurality of pads, the mask having openings provided therein over at least two pads of the plurality of pads;

an integrated circuit die over the substrate; and a conductive adhesive in the openings in conductive contact with the at least two pads of the plurality of pads, the conductive adhesive bonding the integrated circuit die over the substrate.

2. The integrated circuit as claimed in claim 1 wherein the conductive layer is a metal layer bonded to or integrally deposited on the substrate.

3. The integrated circuit as claimed in claim 1 additionally comprising:

a cross-connect in the conductive layer connecting at least two further pads of the plurality of pads; and wherein:

the mask insulates the cross-connect from the conductive adhesive.

4. The integrated circuit as claimed in claim 1 additionally comprising:

a conductive plane over the substrate and under the integrated circuit die, the conductive plane bonded to the substrate by the conductive adhesive and in conductive contact with a pad of the plurality of pads.

5. The integrated circuit as claimed in claim 1 additionally comprising:

a conductive plane over the substrate and bonded to the substrate by the conductive adhesive and in conductive contact by the conductive adhesive with a pad of the plurality of pads; and additional conductive adhesive bonding the integrated circuit die to the conductive plane.

6. An integrated circuit comprising:

a substrate having solder openings provided therein;

a metal layer on the substrate forming a plurality of pads over the solder openings in the substrate;

a soldermask over the plurality of pads, the soldermask having openings provided therein over at least two pads of the plurality of pads;

an integrated circuit die over the substrate; and a conductive die attach adhesive in the openings in conductive contact with the at least two pads of the plurality of pads, the conductive die attach adhesive bonding the integrated circuit die over the substrate.

7. The integrated circuit as claimed in claim 6 wherein the metal layer is bonded to or integrally deposited on the substrate.

8. The integrated circuit as claimed in claim 6 additionally comprising:

a power cross-connect in the metal layer connecting at least two power pads of the plurality of pads; and wherein:

the soldermask isolates and insulates the power cross-connect from the conductive die attach adhesive.

9. The integrated circuit as claimed in claim 6 additionally comprising:

a power cross-connect in the metal layer connecting at least two power pads of the plurality of pads;

a ground plane over the substrate and under the integrated circuit die, the ground plane bonded to the substrate by the conductive die attach adhesive and in conductive contact with a pad of the plurality of pads.

10. The integrated circuit as claimed in claim 6 additionally comprising:

a power cross-connect in the metal layer connecting at least two power pads of the plurality of pads;

a ground plane over the substrate and bonded to the substrate by the conductive die attach adhesive and in conductive contact by the conductive die attach adhesive with a pad of the plurality of pads; and additional conductive die attach adhesive bonding the integrated circuit die to the ground plane.

* * * * *